United States Patent [19]

Lynch

[11] Patent Number: 4,954,313

[45] Date of Patent: Sep. 4, 1990

[54] METHOD AND APPARATUS FOR FILLING HIGH DENSITY VIAS

[75] Inventor: John F. Lynch, Half Moon Bay, Calif.

[73] Assignee: Amdahl Corporation, Sunnyvale, Calif.

[21] Appl. No.: 306,623

[22] Filed: Feb. 3, 1989

[51] Int. Cl.$^5$ .............................. B22F 3/00; B22F 7/00
[52] U.S. Cl. .......................................... 419/9; 419/57; 419/60
[58] Field of Search .................... 419/9, 60, 57

[56] References Cited

U.S. PATENT DOCUMENTS

| | | | |
|---|---|---|---|
| 3,561,110 | 2/1971 | Fuelner et al. | 419/9 |
| 4,024,629 | 5/1977 | Lemoine et al. | 29/625 |
| 4,434,134 | 2/1984 | Darrow et al. | 419/5 |
| 4,671,928 | 6/1987 | Herron et al. | 419/10 |

Primary Examiner—Stephen J. Lechert, Jr.
Assistant Examiner—Leon Nigohosian, Jr.
Attorney, Agent, or Firm—Fliesler, Dubb, Meyer & Lovejoy

[57] ABSTRACT

A method for providing void-free low-electrical-resistance conductive cores in vias having an aspect ratio of greater than approximately 6 includes the steps of providing a conductive thixotropic paste on the top surface of a substrate having vias provided therein, applying pressure to the paste and concurrently applying pressure to the paste and bottom surface of the substrate to force the thixotropic paste into the vias. Vibratory motion may also be applied to the substrate and paste concurrently with the application of pressure and vacuum. The paste is then dried in a vacuum, and subsequently sintered in a two-step process including a slow ramp up to temperature to allow the paste to outgas followed by a high temperature treatment.

19 Claims, 5 Drawing Sheets

METHOD AND APPARATUS FOR FILLING HIGH DENSITY VIAS

BACKGROUND OF THE INVENTION

1. Field of the Invention

The present invention relates to a method of and an apparatus for providing conductive cores in vias in a substrate; more particularly, to a method of filling high aspect ratio vias.

2. Description of the Related Art

A partial listing of conventional techniques for filling vias includes melting, capillary wetting, wedge extrusion, wire insertion, electroless plating, electro-forming, double-sided sputtering and through-hole plating, screen printing and screen printing/stenciling with vacuum pull-through. A discussion of many of these techniques can be found in "Forming Electrical Interconnections Through Semiconductor Wafers," T. R. Anthony, J. Appl. Phys., Vol. 52, No. 8, August 1981. These conventional techniques lack the ability to provide void-free, low resistance conductive cores in high aspect ratio vias. Void-free vias are required to provide the low resistance and reliability required in packages which form the heart of large computing devices.

As used herein, the term "chip(s)" refers to an encapsulated die having bonding pads provided thereon, and the term "package(s)" refers to devices for housing and/or interconnecting plural semiconductor chips.

Two different types of packages have been used to provide connections between the various chips in a package (or interconnect system), so-called "two-dimensional packages" and "three-dimensional packages." In a two-dimensional package individual leads connecting semiconductor chips provided on the exterior of the package pass in the x, y and z directions within the package. Such a package usually comprises a plurality of wafers provided in a stack with x and y interconnects on the surface of or contained in the wafers and z direction interconnections passing through the wafers. The z direction interconnections are usually provided by vias in the wafers.

In a three-dimensional package, semiconductor chips are mounted within the package; semiconductor chips may also be provided on the exterior of the package. Accordingly, a three-dimensional package may incorporate a larger number of semiconductor chips, requiring a larger number of interconnections and greater cooling capabilities. Moreover, the interconnect system becomes more complicated because of the limited areas where x, y and z direction connections can be provided. Again, vias are used to provide the z-axis electrical interconnections. One example of a three-dimensional package is disclosed in co-pending application Ser. No. 154,852, assigned to the assignee of the subject Application, which is hereby incorporated by reference.

To determine the relative capabilities of different packages or interconnect systems several standards are utilized. The most common standard for comparing the relative capabilities of interconnect systems is the number of interconnects per unit volume of package. A similar standard is the number of pins (or leads) per unit volume of package. Other methods of comparison include computing the package volume per chip and the number of gates per unit volume of package.

As the number of interconnects per unit volume increases the density of signal carrying elements must also increase. One such signal carrying element is the vias which transmit electrical signals through substrates, i.e., in the z-axis in a package. The two- and three-dimensional packages currently being designed require increased via densities, reduced via diameters, and, at the same time, reduced via resistivity to increase signal propagation velocities. Increased via densities and reduced via diameters provide more interconnects, but at the same time lead to problems in resistivity and reliability, in particular, reduced via diameters create difficulties in fabricating void-free vias.

The most popular technique for filling vias, particularly those in multilayer printed circuit boards, is screen printing with fine-mesh screens—the age-old technique of silk screening. Certain manufacturers have combined silk screen techniques with the use of a vacuum on the opposite side of the substrate. Silk screening is an unsatisfactory method for filling small-diameter vias because the mesh of the silk screen interferes with proper via filling.

Some manufacturers have created vias using molten metal to melt or burn its way through a substrate while leaving a conductive trail in the substrate. This method is described in the following U.S. Pat. Nos.: 4,398,974; 4,275,400; and 4,239,312.

Another conventional method of via filling involves using a squeegee to force a conductive paste into vias. This method is not useful for high aspect ratio vias where is it necessary to force the paste into a via which has a much greater length than diameter.

Another type of via or through connection and a method of manufacturing same are disclosed in U.S. Pat. Nos. 3,705,332; 3,775,844; and 3,813,773.

All of the conventional via filling methods have one or more severe drawbacks such as:

1. An inability to achieve void-free vias;
2. An inability to fill high aspect ratio vias (via length/via diameter greater than 6);
3. An inability to fill small-diameter vias (diameter less than 150 $\mu$m);
4. A lack of compatibility with high via densities (greater than 5000 vias/in$^2$); and
5. Providing vias with unacceptably large electrical resistance.

SUMMARY OF THE INVENTION

It is, therefore, an object of the present invention to provide a method of fabricating void-free, low-resistivity conductive cores in high density vias.

A further object of the present invention is to provide a method of fabricating conductive cores in vias having an aspect ratio equal to or greater than 6.

Another object of the present invention is to provide a method of fabricating conductive cores in vias having a diameter of less than approximately 150 $\mu$m.

Another object of the present invention is to provide a method of fabricating vias which have a low electrical resistance.

A method of filling vias having an aspect ratio greater than 6 in a substrate having first and second surfaces comprises the steps of: (a) providing a layer of thixotropic metal paste on a first surface of the substrate to a depth greater than the length of the vias, (b) providing a diffuser plate having 20 micron or less pores on the second surface of the substrate, (c) applying a vacuum to each via at the second surface of the substrate through the diffuser plate, (d) applying pressure to the metal paste on the first surface of the substrate concurrently with said step (c), and (e) applying vibratory motion to the substrate concurrently with said steps (c) and (d).

An apparatus for filling high density vias in a substrate having first and second surfaces, comprises means for supporting the substrate, a pressure chamber having a portion thereof defined by the first surface of the substrate, means for providing a pressurized gas to said pressure chamber, a vacuum chamber having a portion thereof defined by the second surface of the substrate, and means for drawing a vacuum in said vacuum chamber.

DESCRIPTION OF THE PREFERRED EMBODIMENTS

This invention relates to a method and apparatus for providing vias having solid conductive cores. The apparatus and method of the present invention is useful for filling vias formed in various types of substrates. The substrates are usually formed of a dielectric material, for example, ceramics or glasses. The substrates may comprise a single layer, such as a glass substrate, or a plurality of layers, such as a ceramic substrate which includes many layers of green sheets which are stacked and then fired.

Figure 1:
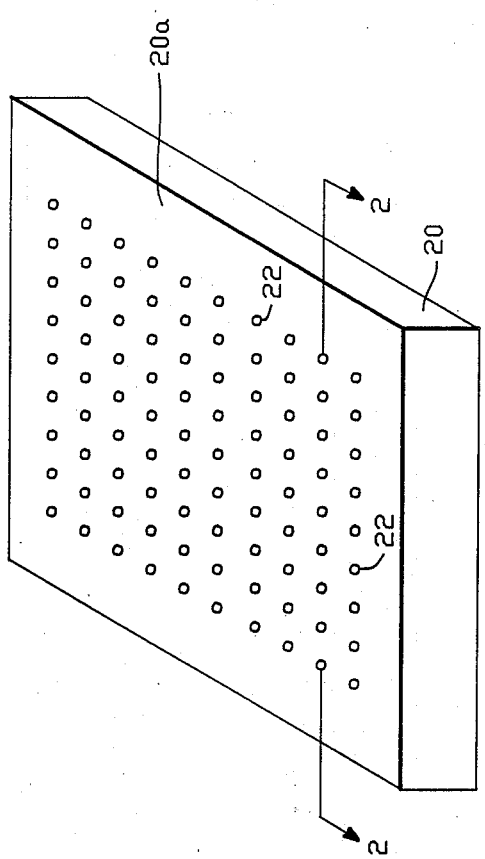
FIG. 1 is an isometric view of a wafer having a plurality of vias.
Figure 2:
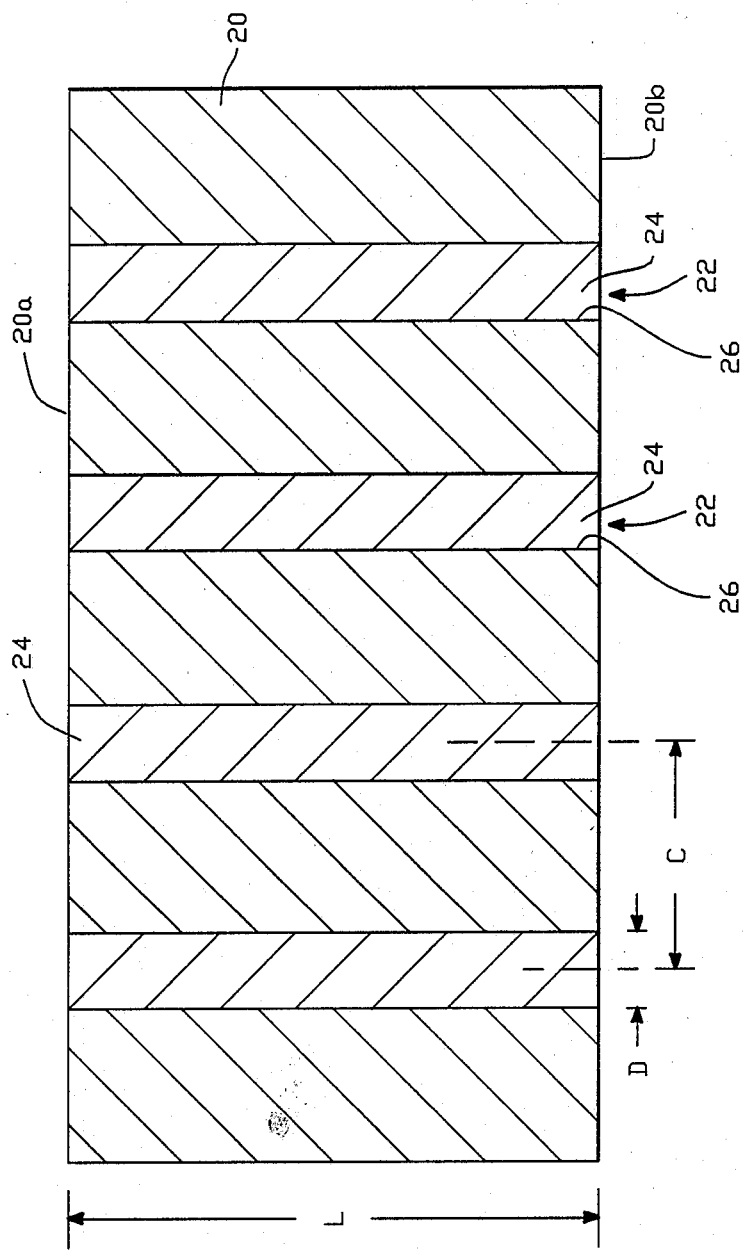
FIG. 2 is a sectional view along line 2—2 in FIG. 1.

FIG. 1 illustrates a substrate 20 having vias 22 formed therein. As shown in FIG. 2, each via 22 has a diameter D and the length L, and adjacent vias have a center-to-center distance C. The vias 22 have an aspect ration defined as L/D; the present invention is particularly directed to vias where the aspect ratio $L/D \geq 6$. For glass substrates, the vias may be etched into the substrate during substrate manufacturing. Vias may be formed in ceramic substrates by methods such as laser drilling.

The fine tolerances and the desire for high yields necessitates verification of the integrity of each substrate. Substrate integrity is checked by the use of red dye and fluorescent dye penetrants, combined with optical examinations using powers up to 100× magnification. The ability to detect microcracks in a substrate is enhanced by subjecting the substrate to 60 psi of air pressure while immersed in a penetrant for periods of approximately two hours. Observations of the ceramic substrates treated with a red dye penetrant are made using visible light, and visual observations of the glass substrate subject to the fluorescent dye penetrant are made using black ultraviolet light.

Conductive cores 24 for vias 22 may be formed of various conductive materials, including metals such as gold, silver, copper, and aluminum, and alloys of these metals. Some basic criteria for conductive core materials include a matching of the coefficients to thermal expansion of the substrate 22 and the conductive core 24, and the ability to provide the material for the conductive core 24 in a form which is useful with the method of the present invention, for example, as a thixotropic conductive paste.

Figure 3A:
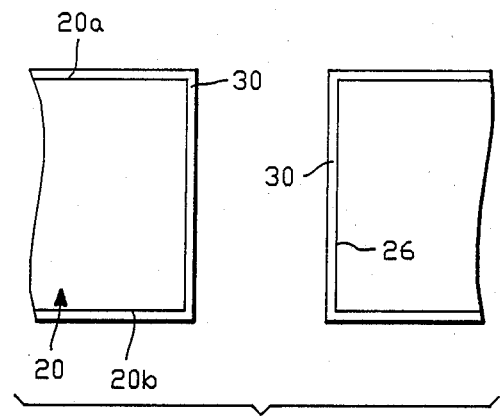
FIG. 3A–C are sectional views of a via for describing a pre- via filling surface treatment method of the present invention.
Figure 3B:
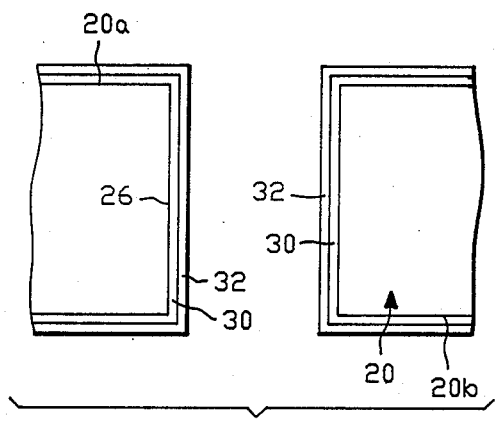
Figure 3C:
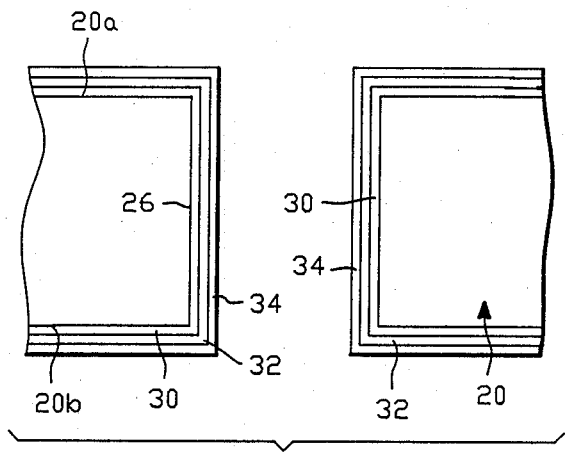

The substrate 20 is subject to a surface treatment process in order to enhance the adhesion between substrate 20 and conductive cores 24. A surface treatment process in accordance with the preferred embodiment of the present invention will be described with reference to FIGS. 3A–C. The purpose of the surface treatment process is to provide a thin layer of conductive material on the surface of vias 20, so that the conductive cores 24 have a material to adhere to. First, a layer of chrome 30 is sputtered on the first and second surfaces 20a, b of substrate 20 and on the surfaces 26 of vias 22. The thickness of the chrome layer ranges from approximately 100Å to approximately 500Å. Then, a layer of copper having a thickness ranging from approximately 3,000 to 7,000Å is sputtered onto the chrome layer 30. A second layer of copper 34 is formed on the first copper layer 32 by a plating process. The thickness of second copper layer 34, which may be provided by an electrolytic bath, ranges from approximately 5 to 10 microns. The three layers, 30, 32 and 34 provided by the surface treatment will be collectively referred to as surface layer 40.

Figure 4A:
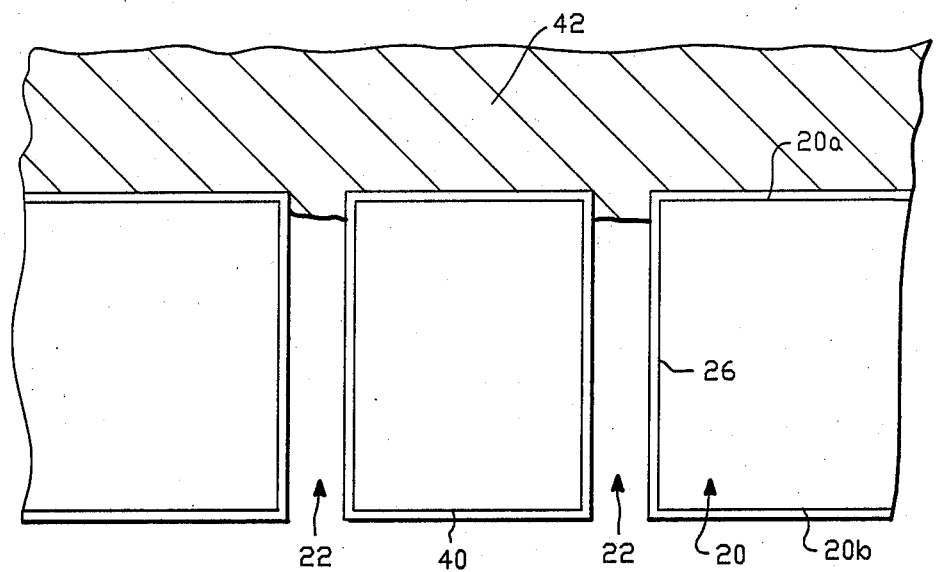
FIGS. 4A–C are sectional views of a via for describing the via filling method of the present invention.
Figure 4B:
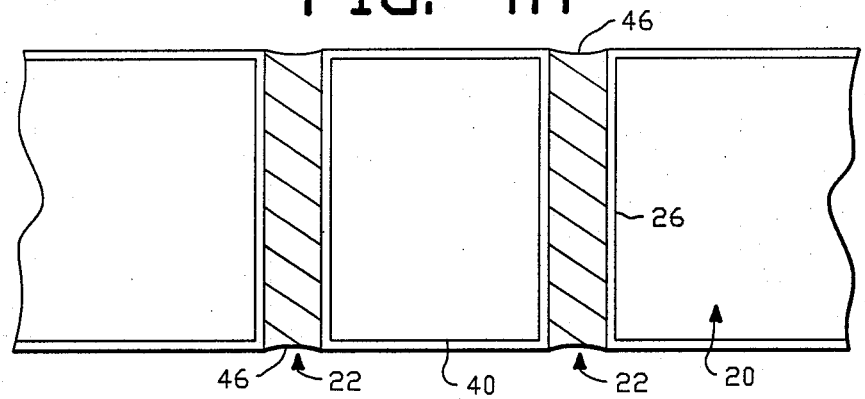
Figure 4C:
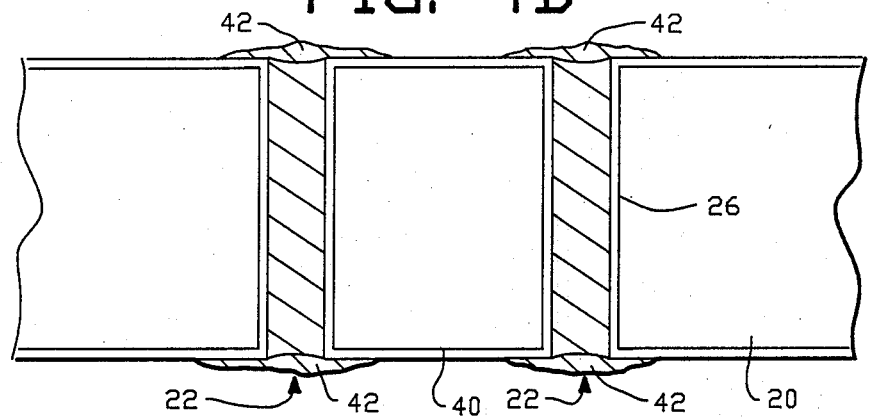

The via filling process will be described with reference to FIGS. 4A–C. With reference to FIG. 4A, a layer of a thixotropic metal paste 42 is provided at the first surface 20a of substrate 20. In the preferred embodiment, the layer of paste 42 has a thickness which is approximately equal to or greater than the length L of vias 22. The thixotropic paste 42 is forced into vias 22 by the combined, concurrent application of pressure above the thixotropic paste 42 and the application of a vacuum at the ends of vias 22 exposed at second surface 20b of substrate 20. In addition, a vibratory motion may be applied to substrate 20 in order to aid in filling vias 22 with thixotropic paste 42.

After the vias 22 are filled with thixotropic paste 42, the excess paste 42 on surface 20a is removed with a squeegee. Then, the paste 42 is dried in a vacuum, and then cured in a sintering process. Sintering the Paste 42 is a two-step process, including a long ramp up to temperature and a shorter high-temperature treatment. The slow temperature ramp up is required to allow outgassing of the paste 42 in the vias. The length of the vias, e.g., 30 to 40 mils, creates an outgassing distance of 15 to 20 mils. Outgassing is caused by the removal of the binder in the paste 42, and if the temperature is increased too rapidly, black coring" occurs. Black coring is a buildup of unburned, non-conductive carbon material in the center of the vias 22. For vias having a length of 30 to 40 mils and a diameter of 2 to 5 mils, the temperature is increased from room temperature to approximately 600° C. over a period ranging from 30 to 50 minutes.

The second step in the sintering process is a 5 to 10 minute period at a temperature greater than approximately 600° C. in an atmosphere comprising nitrogen and less than 10 ppm of oxygen. The time of the second phase of the sintering process will vary depending on the temperature used and the length L and diameter D of the vias 22. If the temperature is higher than 600° C., the time will be decreased, if the temperature is less than 600° C., the time will be increased. However, a minimum temperature of 580° C. is required to achieve the desired characteristics of the cores 24. Sintering temperatures generally range from 600° to 950° C.

The sintering process usually causes a slight contraction of the core 24 along the direction of the length of the core, resulting in the formation of cusps 46 (FIG. 4B) at the ends of cores 24. If cusps 46 are present, it is necessary to fill the cusps so that the substrate and vias 22 provide a planar surface. To fill the cusps 46, a thixotropic paste 42 is provided on both the first and second surfaces 20 a, b of substrate 20 and forced into cusps 46 by, for example, the use of a squeegee. The thixotropic paste 42 is then reapplied so that the cusps are overfilled, to prevent the reformation of cusps when the cusp filling paste is sintered. The sintering process is then repeated for the paste 42 used to fill cusps 46.

To provide the structure shown in FIG. 2, both surfaces 20 a, b of substrate 20 are lapped and polished to remove the conductive adhesion layer. Thereafter, the substrates are inspected for dimensional accuracy and the vias 22 are electrically tested.

Figure 5:
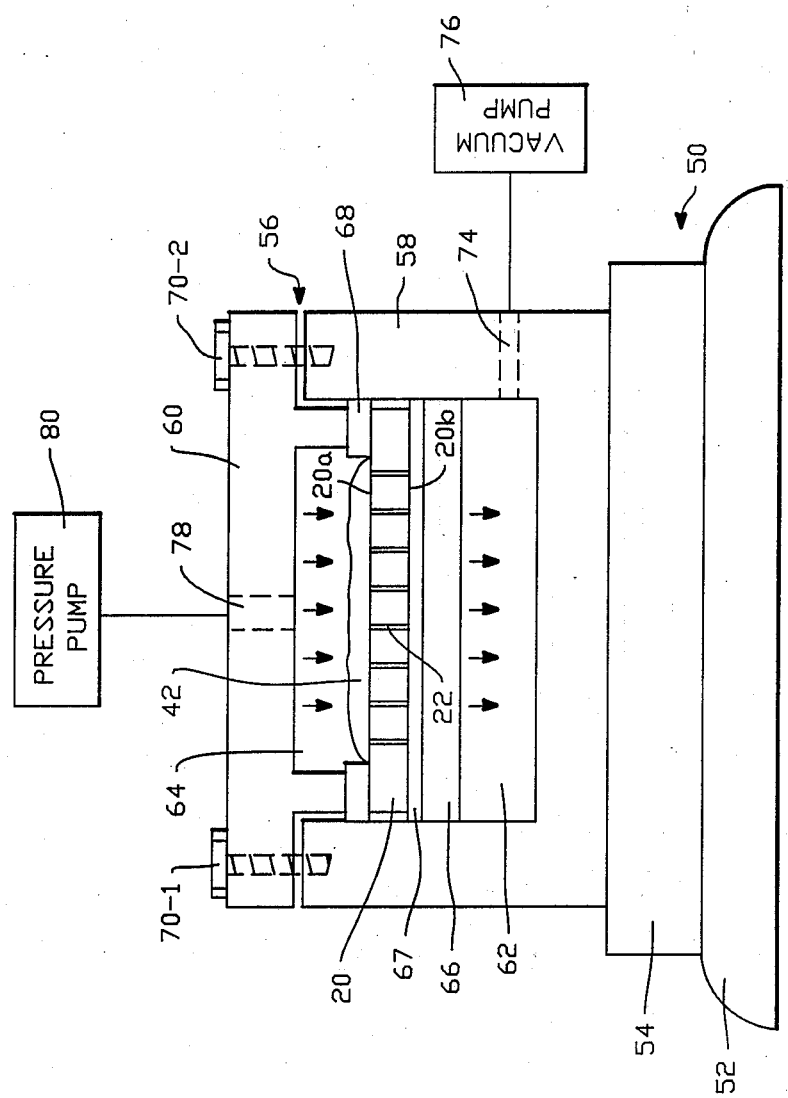
FIG. 5 is a partial sectional, end view of an apparatus for filling high-density vias in accordance with the present invention.

An apparatus 50 for performing the via filling process of the present invention will be described with reference to FIG. 5. Apparatus 50 has as its base a vibrating means including, for example, a Meinzer vibrating machine 52, and a vibrating table 54 provided on vibrating machine 52. The vibrating machine 52 provides variable amplitude and displacement vibrations in the x, y and z axes. Apparatus 50 has a frame 56 including a base 58 and a cover 60 which support a substrate 20 and a pressure chamber 64 above substrate 20.

Substrate 20 rests on a support table 66 which is attached to base 58, and a gasket 68 is held between cover 60 and substrate 20 through the application of pressure by screws 70-1 and 70-2. The pressure provided by screws 70-1 and 70-2 forces gasket 68 into a sealable engagement with both substrate 20 and base 58, thereby providing a seal for both vacuum chamber 62 and pressure chamber 64. A vacuum outlet 74 in base 58 allows vacuum pump 76 to communicate with vacuum chamber 62. A pressure inlet 78 in cover 60 likewise allows a pressure pump 80 to communicate with pressure chamber 64.

Support table 66 includes a diffuser plate 67 comprising, for example, a 15 micron porous filter be uniformly applied to each via 22. The properties of the filter forming diffuser plate 67 is related to the via diameter D by the following relationships: (1) the pore size is approximately D/3; and (2) the center-to-center distance of the pores is less than or equal to D.

In operation, substrate 20 is placed on support table 66, gasket 68 is set in place, and then thixotropic paste 42 is provided on the first surface 20a of substrate 20. Cover 60 is then installed and gasket 68 is pressurized by screws 70-1 and 70-2. A vacuum is provided in vacuum chamber 62 by vacuum pump 72 and pressure is concurrently created in pressure chamber 64 by pressure pump 80. The vacuum in chamber 62 is adjusted so that the vacuum in each via 22 ranges from 1 to 25 mmHg. The pressure in pressure chamber 64 ranges from 1 to 30 psi.

The combination of pressure above paste 42 and a vacuum at the opposite end of each via 20 from the paste 42, combined with vibratory motion, if necessary, provides void-free fillings for vias having an aspect ratio greater than 6.

It has demonstrated that using the method of the present 19,405 (8 mil. diameter) vias have been and sintered in 2.2 in×2.2 in.×0.025" thick and fotoceram substrate materials using a mixed copper paste to achieve 100% electrical continuity. Further, the present invention has been used to fill and sinter 2,504 (5 mil. diameter) via an alumina substrate using copper paste, providing conductive cores having 100% electrical continuity.

The many features and advantages of the via filling method and apparatus of the present invention will be apparent to those skilled in the art. Thus, the following claims are intended to cover all modifications and equivalents falling within the scope of the invention.

What is claimed is:

1. A method for filling high density vias in a substrate, comprising the steps of:
   (a) providing a metal paste on a first surface of the substrate;
   (b) applying a vacuum to each via at the second surface of the substrate; and
   (c) applying pressure to the metal paste on the first surface of the substrate concurrently with said step (b).

2. A method of filling vias according to claim 1, further comprising the step (d) of applying vibratory motion to the substrate concurrently with said steps (b) and (c).

3. A method of filling vias according to claim 2, further comprising the step (e) of increasing the pressure of the region adjacent to the metal paste on the first surface of the substrate above the ambient atmospheric pressure concurrently with said step (d).

4. A method of filling vias according to claim 3, further comprising the step (f) of sintering the metal paste after said steps (b), (c), (d), and (e).

5. A method of filling vias according to claim 2, further comprising the step (e) of sintering the metal paste after said steps (b), (c), and (d).

6. A method of filling vias according to claim 4, wherein said step (f) comprises the sub-steps of:
   (i) heating the substrate and the metal paste from room temperature to a temperature greater than 500° C. over a period of greater than 30 minutes; and
   (ii) maintaining the substrate and the metal paste at a temperature greater than 580° C. for a period of approximately 5–10 minutes in an atmosphere comprising $N_2$ and less than 10 ppm of $O_2$.

7. A method of filling vias according to claim 5, wherein said step (e) comprises the sub-steps of:
   (i) heating the substrate and the metal paste from room temperature to a temperature greater than 500° C. over a period of greater than 30 minutes; and
   (ii) maintaining the substrate and the metal paste at a temperature in the range of 580°–950° C. for a period of approximately 5–10 minutes in an atmosphere comprising $N_2$ and less than 10 ppm of $O_2$.

8. A method of filling vias according to claim 1, wherein said step (b) comprises the sub-steps of:
   (i) providing a diffuser plate on the second surface of the substrate; and
   (ii) applying a vacuum to each via through the diffuser plate.

9. A method of filling vias according to claim 2, wherein said step (b) comprises the sub-steps of:
   (i) providing a diffuser plate on the second surface of the substrate; and
   (ii) applying a vacuum to each via through the diffuser plate.

10. A method of filling vias having an aspect ratio greater than 6:1 in a substrate having first and second surfaces, comprising the steps of:
(a) providing a conductive coating in the vias;
(b) providing a layer of thixotropic metal paste on a first surface of the substrate to a depth greater than the length of the vias;
(c) providing a diffuser plate on the second surface of the substrate, the diffuser plate having pores with a diameter approximately ⅓ the diameter of the vias and a center-to-center distance less than the diameter of the vias;
(d) applying a vacuum to each via at the second surface of the substrate through the diffuser plate; and
(e) applying pressure to the metal paste on the first surface of the substrate concurrently with said step (d).

11. A method according to claim 10, further comprising the step (f) of applying vibratory motion to the substrate concurrently with said steps (d) and (e).

12. A method of filling vias according to claim 10, wherein said step (e) comprises increasing the pressure of the region adjacent to the metal paste on the first surface of the substrate above the ambient atmospheric pressure.

13. A method of filling vias according to claim 11, further comprising the step (g) of sintering the metal paste after said steps (d), (e) and (f).

14. A method of filling vias according to claim 13, further comprising the steps of:
(h) removing any oxide formed in said step (g) from the vias, and
(i) filling any depressions at the surface of the vias with metal paste.

15. A method of providing void-free conductive vias having an aspect ratio greater than 6:1 in a substrate having first and second surfaces, comprising the steps of:
(a) providing a layer of chrome on the substrate and in the vias and then providing a layer of copper on the layer of chrome;
(b) providing a layer of thixotropic metal paste on a first surface of the substrate to a depth greater than the length of the vias;
(c) providing a diffuser plate on the second surface of the substrate, the diffuser plate having pores with a diameter approximately ⅓ the diameter of the vias and a center-to-center distance less than the diameter of the vias;
(d) applying a vacuum ranging from 1-25 mm Hg to each via at the second surface of the substrate through the diffuser plate;
(e) applying pressure ranging from 1-30 psi to the metal paste on the first surface of the substrate concurrently with said step (d);
(f) sintering the metal paste after said steps (d) and (e);
(g) removing any oxide formed in said (f) from said vias;
(h) filling any depressions at the surface of the visa with a metal paste;
(i) sintering the metal paste after said step (h); and
(j) removing the chrome and copper layers from the first and second surfaces of the substrate.

16. A method of providing conductive cores according to claim 15, wherein said steps (d) and (e) are performed for a time ranging from 30 seconds to 10 minutes.

17. A method according to claim 15, wherein said step (a) comprises the substeps of:
(i) depositing a layer of chrome;
(ii) depositing a first layer of copper by sputtering;
(iii) depositing a second layer of copper on the first layer of copper by plating; and
(iv) removing any copper oxide from the surface of the second layer of copper.

18. A method of filling vias according to claim 15, further comprising the step (k) of applying vibratory motion to the substrate concurrently with said steps (d) and (e).

19. A method of filling vias according to claim 18, wherein the step (f) comprises the sub-steps of:
(i) heating the substrate and the metal paste from room temperature to a temperature greater than 500° C. over a period of greater than 30 minutes; and
(ii) maintaining the substrate and the metal paste at a temperature greater than 580° C. for a period of approximately 5-10 minutes in an atmosphere comprising $N_2$ and less than 10 ppm of $O_2$.

* * * * *